United States Patent
Lo et al.

(10) Patent No.: US 9,160,322 B2
(45) Date of Patent: Oct. 13, 2015

(54) CLOCK EDGE DETECTION DEVICE AND METHOD

(71) Applicant: REALTEK SEMICONDUCTOR CORPORATION, Hsinchu (TW)

(72) Inventors: Yu-Cheng Lo, Taichung (TW); Ying-Yen Chen, Chiayi County (TW); Chao-Wen Tzeng, Taichung (TW); Jih-Nung Lee, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/314,932

(22) Filed: Jun. 25, 2014

(65) Prior Publication Data

US 2015/0022242 A1    Jan. 22, 2015

(30) Foreign Application Priority Data

Jul. 22, 2013  (TW) .............................. 102126026 A

(51) Int. Cl.
*H03K 5/153* (2006.01)
*H03K 5/1534* (2006.01)

(52) U.S. Cl.
CPC .................................... *H03K 5/1534* (2013.01)

(58) Field of Classification Search
CPC ................................................... H03K 5/1534
USPC ................ 327/24, 12; 375/371, 355
See application file for complete search history.

(56) References Cited

U.S. PATENT DOCUMENTS

| | | | |
|---|---|---|---|
| 6,041,089 A * | 3/2000 | Yokomizo .................... | 375/371 |
| 6,404,833 B1 * | 6/2002 | Takebe ......................... | 375/371 |
| 6,671,652 B2 | 12/2003 | Watson, Jr. et al. | |
| 6,838,912 B1 * | 1/2005 | Chou ............................... | 327/3 |
| 7,400,555 B2 | 7/2008 | Franch et al. | |
| 7,403,055 B2 | 7/2008 | Minzoni | |
| 7,418,068 B2 * | 8/2008 | Barrett et al. ................ | 375/355 |
| 7,990,191 B2 * | 8/2011 | Fujino et al. ................. | 327/156 |
| 8,415,983 B2 * | 4/2013 | Tokairin .......................... | 327/12 |
| 2002/0050842 A1 * | 5/2002 | Soda ............................... | 327/24 |

OTHER PUBLICATIONS

Office Action and Search Report dated May 14, 2015 for the counterpart TW application No. 102126026.

(Continued)

*Primary Examiner* — Ryan Jager
(74) *Attorney, Agent, or Firm* — WPAT, P.C.; Anthony King

(57) ABSTRACT

The present invention discloses a clock edge detection device capable of detecting the positive and negative edges of a target clock, comprising: a delay circuit for receiving the target clock and transmitting it; a register circuit coupled to the delay circuit for recording and outputting plural target clock levels in accordance with a working clock; a positive edge detection circuit including a plurality of positive edge detectors coupled to the register circuit for detecting the positive edge of the target clock; and a negative edge detection circuit including a plurality of negative edge detectors coupled to the register circuit for detecting the negative edge of the target clock, wherein the positive edge detection circuit is operable to perform a logic operation to the target clock levels while the negative edge detection circuit is operable to perform a different logic operation to the target clock levels.

20 Claims, 7 Drawing Sheets

(56) References Cited

OTHER PUBLICATIONS

English abstract translation of the Office Action dated May 14, 2015 for the counterpart TW application No. 102126026.

Staszewski, R.B., et al., "TDC-based frequency synthesizer for wireless applications", IEEE Radio Frequency Integrated Circuits (RFIC) Symposium, Jun. 6-8, 2004.

* cited by examiner

CLOCK EDGE DETECTION DEVICE AND METHOD

BACKGROUND OF THE INVENTION

1. Field of the Invention

The present invention relates to a level detection device and method, especially to a clock edge detection device and method.

2. Description of Related Art

A general electronic circuit needs a reference clock for its individual elements operating properly or different elements functioning synchronously. Said reference clock is usually generated by a frequency synthesizer with a source clock. In order to make sure that the level high and level low durations of the reference clock are the same for preventing malfunction, the frequency synthesizer is supposed to generate the reference clock of 50% duty cycle. However, due to the limitation such as manufacturing process variation, the frequency synthesizer is likely to generate a reference clock having the duty cycle other than 50%. Moreover, in consideration of the limited design resources, the frequency synthesizer might lack for a preinstalled calibration function to correct the duty cycle. Therefore, in view of the problem caused by process variation and the cost-effective issue about design resources, a solution capable of detecting the duty cycle of a reference clock is desired, which is supposed to be capable of determining the influence caused by process variation or the like and then providing the analysis for clock skew calibration or future design reference.

Those interested in more detail of the prior art references may refer to the following documents: U.S. Pat. No. 6,671,652, U.S. Pat. No. 7,400,555, and U.S. Pat. No. 7,403,055.

SUMMARY OF THE INVENTION

In consideration of the problems of the prior art, the present invention provides a clock edge detection device and a clock edge detection method to detect the positive and negative edges of a target clock, and thereby generate a detection result for exploitation.

Besides, the present clock edge detection device and method may further calculate the duty cycle of the target clock for clock skew calibration or future design reference.

The present invention discloses a clock edge detection device capable of detecting the positive and negative edges of a target clock. An embodiment of the clock edge detection device comprises: a delay circuit including a plurality of delay units connected in series for receiving and transmitting the target clock; a register circuit including a plurality of registers coupled to the delay circuit for recording and outputting target clock levels of the target clock in accordance with a working clock in which each of the registers includes a data input end for receiving the target clock from one of the delay units, a data output end, and a working clock reception end for receiving the working clock; a positive edge detection circuit including a plurality of positive edge detectors coupled to the data output ends of the register circuit for detecting the positive edge of the target clock in which each of the positive edge detectors includes a positive edge detection unit for generating a positive edge detection value according to the target clock levels from adjacent two of the registers; and a negative edge detection circuit including a plurality of negative edge detectors coupled to the data output ends of the register circuit for detecting the negative edge of the target clock in which each of the negative edge detectors includes a negative edge detection unit for generating a negative edge detection value according to the target clock levels from adjacent two of the registers.

In the above-mentioned embodiment, the clock edge detection device may further comprise a calculation circuit coupled to the positive and negative edge detection circuits for calculating the duty cycle of the target clock according to the positive and negative edge detection values.

The present invention also discloses a clock edge detection method capable of detecting the positive and negative edges of a target clock, which is carried out by the clock edge detection device of this invention or its equivalent. An embodiment of the clock edge detection method comprises: receiving the target clock and transmitting it by a predetermined transmission arrangement; recording a plurality of target clock levels according to a working clock; executing a positive edge detection logic operation according to the target clock levels, so as to detect the positive edge of the target clock and generate a plurality of positive edge detection values; storing the plurality of positive edge detection values; executing a negative edge detection logic operation according to the target clock levels, so as to detect the negative edge of the target clock and generate a plurality of negative edge detection values; and storing the plurality of negative edge detection values, wherein the positive and negative edge detection logic operations are distinct from each other.

In the above-mentioned embodiment, the clock edge detection method may further comprise the step of calculating the duty cycle of the target clock according to the positive and negative edge detection values.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description uses language by referring to terms in the field of this invention. If any term is defined in the specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. Furthermore, this invention relates to a clock edge detection device and method, and thus the known detail in this field will be omitted if such detail has little to do with the features of the present invention.

The present invention contains a clock edge detection device and method capable of detecting the positive and negative edges (a.k.a. rising and falling edges) of a target clock to thereby generate a detection result for exploitation. Said device and method are applicable to an integrated circuit or a system device. Please note that although this specification gives sufficient embodiments, people of ordinary skill in the art can still choose components or steps equivalent to those described in this specification to carry out the present invention, which means that the scope of this invention is not limited to the embodiments in the specification. Besides, since some element by itself of said clock edge detection device could be known, the detail of such element will be omitted provided that this omission nowhere dissatisfies the disclosure and enablement requirements. Similarly, since the clock edge detection method of the present invention can be carried out by the present device or its equivalent, the following description will abridge the hardware details for executing the method provided that the remained disclosure is still enough for understanding and enabling the method invention.

Figure 1:
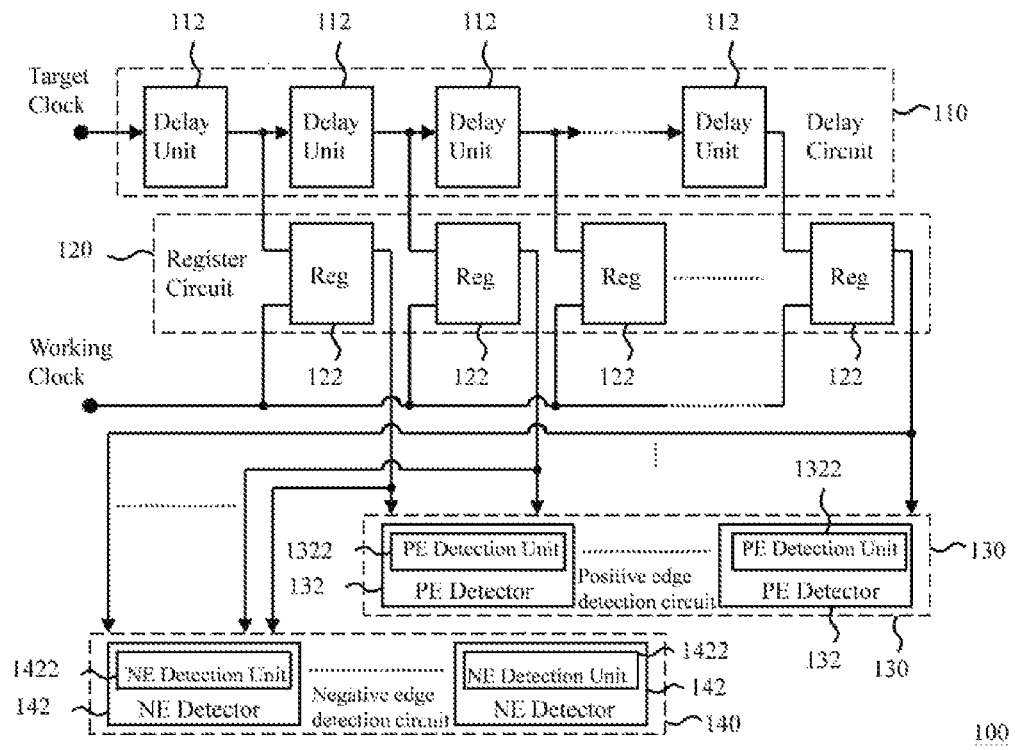
FIG. 1 illustrates an embodiment of the clock edge detection device of the present invention.

Please refer to FIG. 1 which illustrates an embodiment of the clock edge detection device of the present invention. This embodiment is capable of detecting the positive and negative edges of a target clock, and generating a plurality of positive and negative edge detection values for exploitation. Said target clock could be or be derived from a clock likely to have clock skew in an integrated circuit, or a clock sensitive to clock skew in the integrated circuit. As shown in FIG. 1, the clock edge detection device 100 comprises: a delay circuit 110; a register circuit 120; a positive edge detection circuit 130; and a negative edge detection circuit 140. Said delay circuit 110 includes a plurality of delay units 112 (e.g. inverters, buffers, or the combination thereof) which are connected in series for receiving and transmitting the target clock. Said register circuit 120 includes a plurality of registers 122 (Reg) coupled to the delay circuit 110 for recording and outputting plural target clock levels of the target clock in accordance with a working clock, in which each of the registers 122 includes a data input end for receiving the target clock from a node between two adjacent delay units 112, a data output end, and a working clock reception end for receiving the working clock. Said positive edge detection circuit 130 includes a plurality of positive edge detectors 132 (PE Detector) coupled to the data output ends of the register circuit 120 for detecting the positive edge of the target clock, in which each of the positive edge detectors 132 includes a positive edge detection unit 1322 (PE Detection Unit) (e.g. a logic gate or the combination of different logic gates) coupled to a data output end between two adjacent registers 122 for generating a positive edge detection value according to the target clock levels from said two adjacent registers 122. Finally, said negative edge detection circuit 140 includes a plurality of negative edge detectors 142 (NE Detector) coupled to the data output ends of the register circuit 120 for detecting the negative edge of the target clock, in which each of the negative edge detectors 142 includes a negative edge detection unit 1422 (NE Detection Unit) (e.g. a logic gate or the combination of different logic gates) coupled to a data output end between two adjacent registers 122 for generating a negative edge detection value according to the target clock levels from said two adjacent registers 122. Afterwards, the positive and negative edge detection values could be used for defining the duty cycle of the target clock; this part will be explained in detail in the following paragraphs.

Figure 2A:
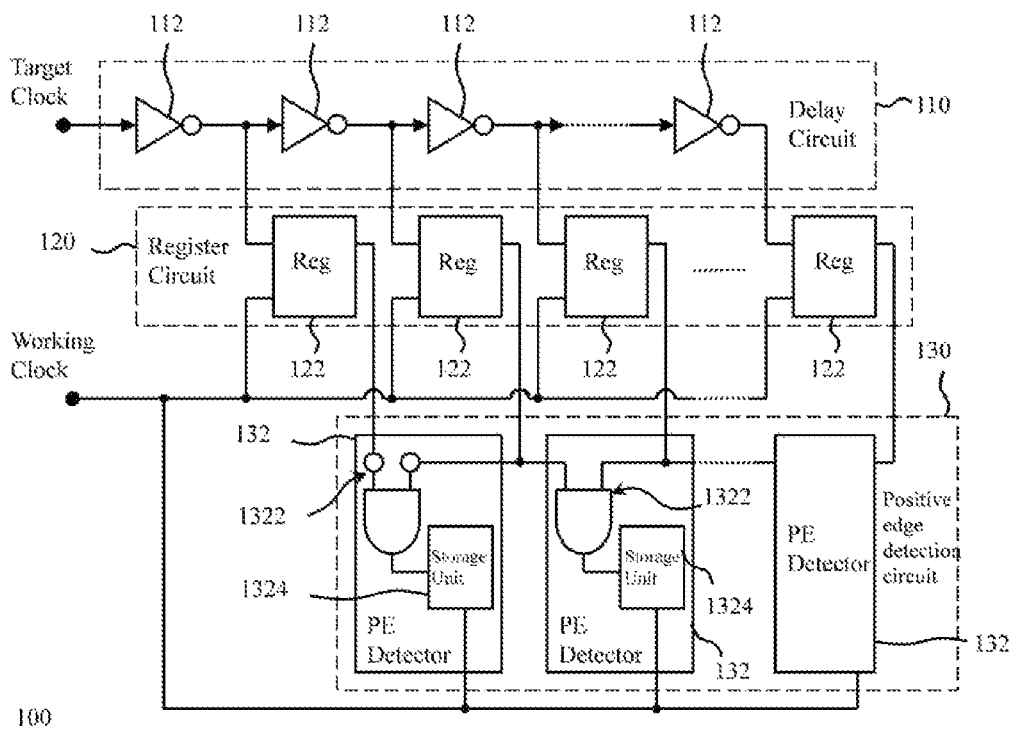
FIG. 2a illustrates an embodiment of the positive edge detection circuit of FIG. 1.
Figure 2B:
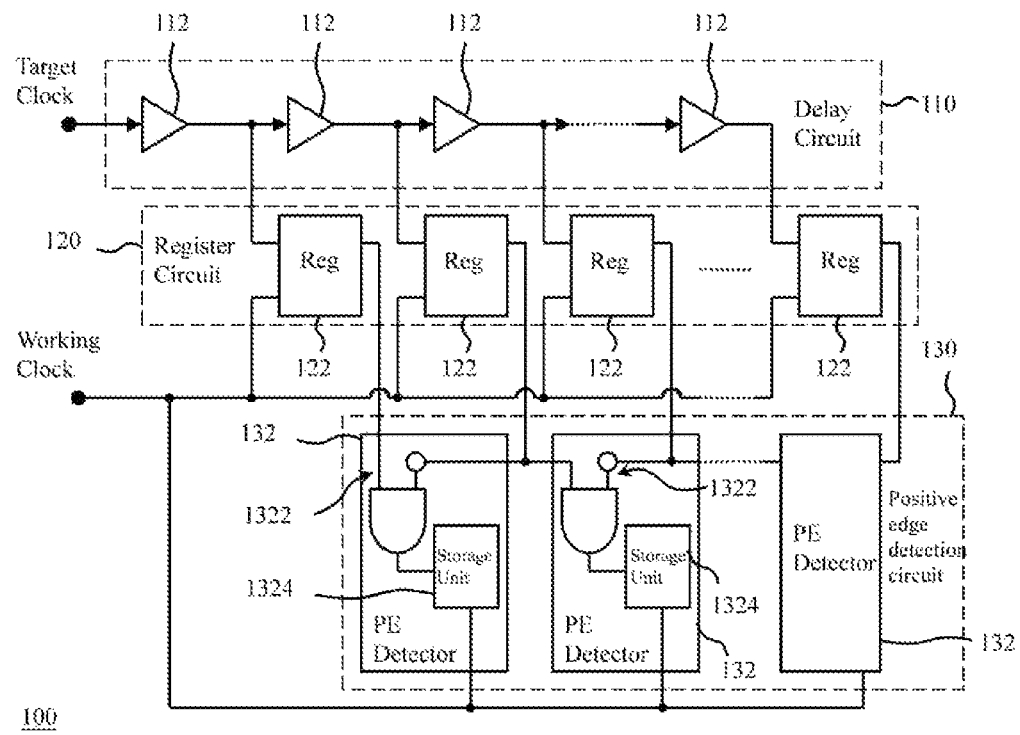
FIG. 2b illustrates another embodiment of the positive edge detection circuit of FIG. 1.

Please refer to FIG. 1 again. The delay circuit 110 can be composed of one or more inverters and/or one or more buffers; and in light of the number of inverter(s) through which the target clock passes, each positive edge detector 132 and each negative edge detector 142 will perform different operation to the target clock levels respectively, so as to carry out the positive and negative edge detection. For instance, if both the target clock levels from two registers 122 bound for a positive edge detector 132 pass through an odd or even number of inverter(s) (which includes the case of no inverter), this positive edge detector 132 will perform an inversion process to the transmission-sequence-later one of the two target clock levels, and then performs a Logic-AND process to both the target clock levels (as shown in FIG. 2b); if the two target clock levels bound for a positive edge detector 132 pass through an odd number of inverter(s) and an even number of inverter(s) respectively, this positive edge detector 132 will perform the inversion and Logic-AND processes to both the target clock levels when it pertains to an odd number in a connection sequence of the positive edge detectors 132, but will perform the Logic-AND process to both the target clock levels when it pertains to an even number of said positive edge detector connection sequence (as shown in FIG. 2a). On the other hand, if both the target clock levels bound for a negative edge detector 142 pass through an odd or even number of inverter(s) (which also includes the case of no inverter), this negative edge detector 142 will perform the inversion process to the transmission-sequence-early one of the two target clock levels and then performs the Logic-AND process to both the target clock levels (as shown in FIG. 3b); and if the two target clock levels bound for a negative edge detector 142 pass through an odd number of inverter(s) and an even number of inverter(s) respectively, this negative edge detector 142 will perform the Logic-AND process to both the target clock levels when it pertains to an odd number in a connection sequence of the negative edge detectors 142, but will perform the inversion and Logic-AND processes to both the target clock levels when it pertains to an even number of said negative edge detector connection sequence (as shown in FIG. 3a).

Please refer to FIG. 2a which illustrates an embodiment of the positive edge detection circuit 130 of FIG. 1. As shown in FIG. 2a, the delay units 112 are inverters in the clock edge detection device 100. In this case, one among any two adjacent positive edge detectors 132 will make use of its positive edge detection unit 1322 to perform an inversion process and a Logic-AND process to the target clock levels while the other positive edge detector 132 will make use of its positive edge detection unit 1322 to perform the Logic-AND process to the target clock levels, so as to generate said positive edge detection values. Besides, please refer to FIG. 2b which illustrates another embodiment of the positive edge detection circuit 130 of FIG. 1. As shown in FIG. 2b, the delay units 112 are buffers in the clock edge detection device 100. In this case, all positive edge detectors 132 will perform the same or an equivalent process to the target clock levels, and thereby generate said positive edge detection values. More specifically, each positive edge detector 132 will make use its positive edge detection unit 1322 to perform a Logic-AND process to the transmission-sequence-early one among the received target clock levels, and perform an inversion process and then the Logic-AND process to the transmission-sequence-later one among the received target clock levels.

Please refer to FIG. 2a and FIG. 2b again. In these two embodiments, each positive edge detector 132 further includes a positive edge detection value storage unit 1324 (e.g. a flip-flop) which is coupled with its positive edge detection unit 1322 for recording the positive edge detection value in accordance with the working clock. However, in an alternative embodiment, these positive edge detectors 132 are coupled to a storage circuit (not shown) of the positive edge detection device 130; the storage circuit are operable to store the positive edge detection values and can be implemented by appropriate known techniques.

Figure 3A:
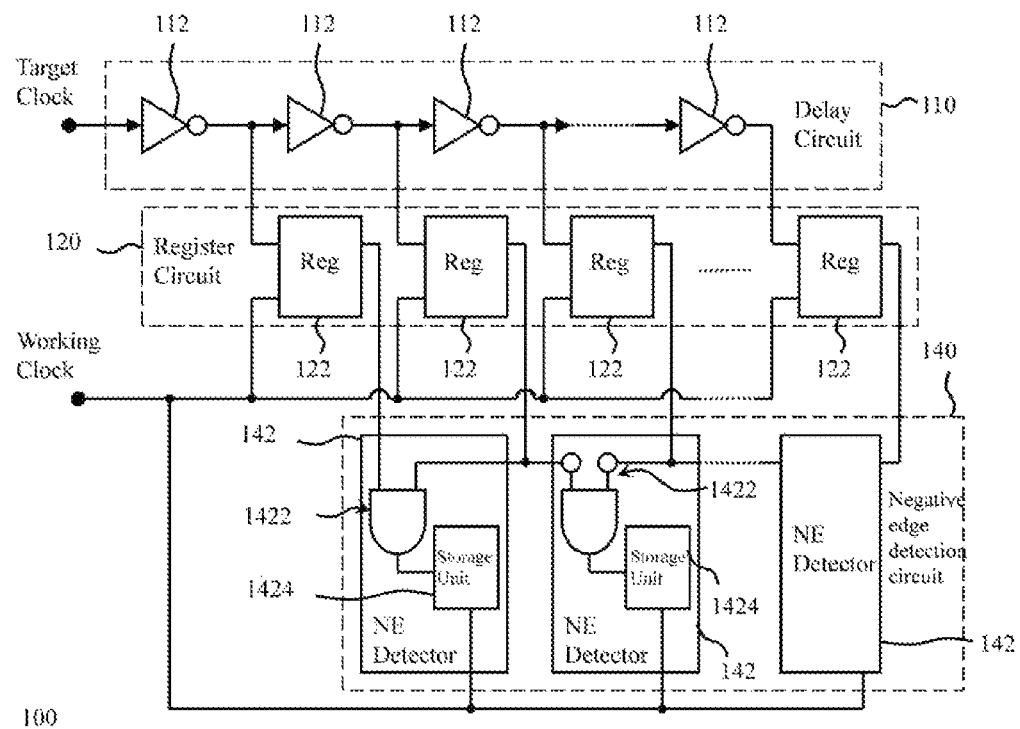
FIG. 3a illustrates an embodiment of the negative edge detection circuit of FIG. 1.
Figure 3B:
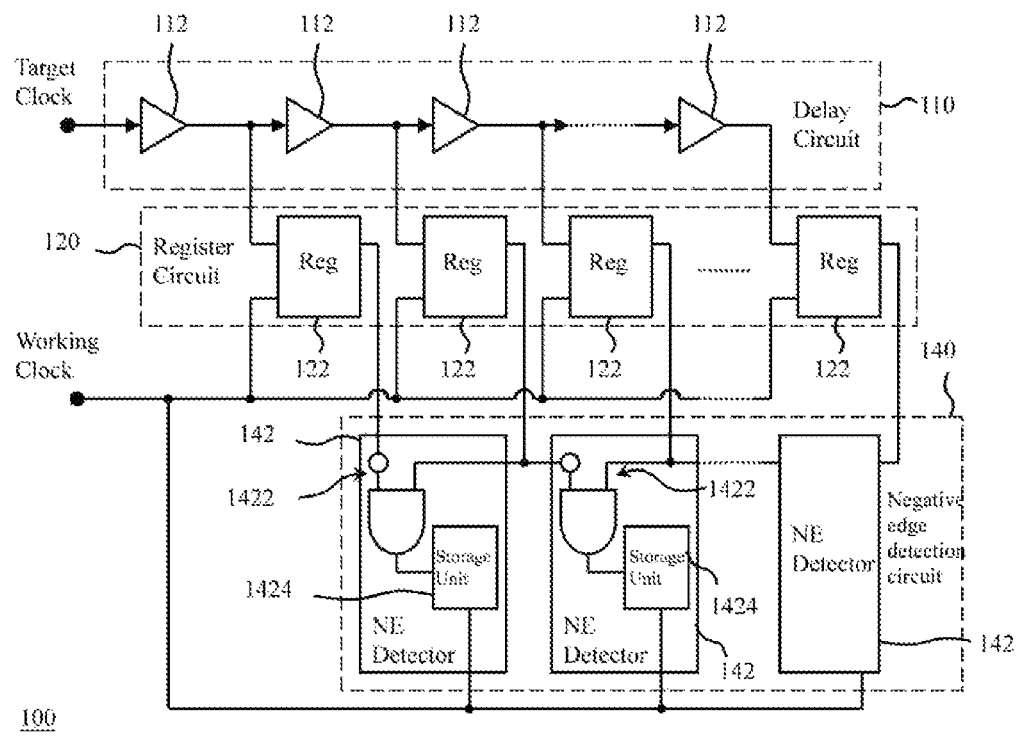
FIG. 3b illustrates another embodiment of the negative edge detection circuit of FIG. 1.

Please refer to FIG. 3a which illustrates an embodiment of the negative edge detection circuit 140 of FIG. 1. As shown in FIG. 3a, the delay units 112 are inverters in the clock edge detection device 100. In this case, one of two adjacent negative edge detectors 142 will perform a Logic-AND process to the target clock levels while the other negative edge detector 142 will perform an inversion process and the Logic-AND process to the target clock levels, so as to generate said negative edge detection values. Furthermore, please refer to FIG. 3b which illustrates another embodiment of the negative edge detection circuit 140 of FIG. 1. As shown in FIG. 3b, the delay units 112 are buffers in the clock edge detection device 100. In this case, all negative edge detectors 142 will perform the same or an equivalent process to the target clock levels, and thereby generate said negative edge detection values. To be more specific, each negative edge detector 142 will make use its negative edge detection unit 1422 to perform an inversion process and a Logic-AND process to the transmission-sequence-early one among the received target clock levels, and perform the Logic-AND process to the transmission-sequence-later one among the received target clock levels.

Please refer to FIG. 3a and FIG. 3b again. In these two embodiments, each negative edge detector 142 further includes a negative edge detection value storage unit 1424 (e.g. a flip-flop) which is coupled with its negative edge detection unit 1422 for recording the negative edge detection value in accordance with the working clock. However, in an alternative embodiment, these negative edge detectors 142 are coupled to a storage circuit (not shown) of the negative edge detection circuit 140; the storage circuit are operable to store the negative edge detection values and can be completed by appropriate known techniques. Please note that the aforementioned positive edge detection values have to record at least two positive edges while the negative edge detection values have to record at least one negative edge, or the negative edge detection values have to record at least two negative edges while the positive edge detection values have to record at least one positive edge, so that the kept clock edges will be sufficient for exploitation. In other words, the number of delay units 112, the number of registers 122, the number of positive edge detectors 132 and the number of negative edge detectors 142 should be enough to take the minimum clock edge information for exploitation.

Figure 4:
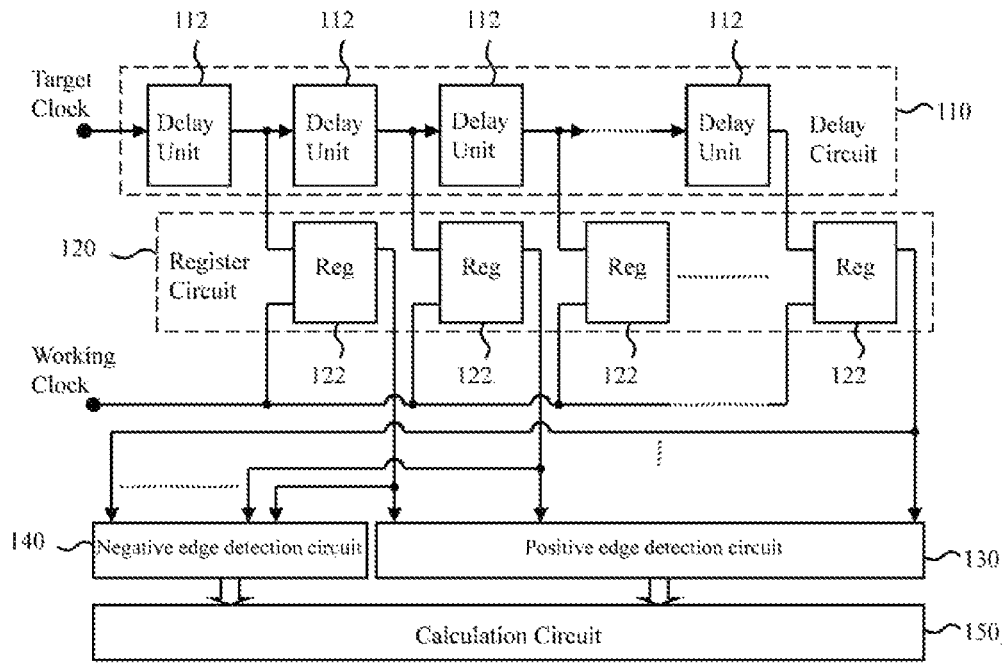
FIG. 4 illustrates another embodiment of the clock edge detection device of the present invention.

Please refer to FIG. 4 which illustrates another embodiment of the clock edge detection device of the present invention. Comparing to FIG. 1, the clock edge detection device 400 further comprises: a calculation circuit 150 coupled to the positive edge detection circuit 130 and the negative edge detection circuit 140 for calculating the duty cycle of the target clock in accordance with the positive and negative edge detection values. More specifically, the calculation circuit 150 determines the numerator of the duty cycle of the target clock according to the interval between a positive edge of the positive edge detection values and a negative edge of the negative edge detection values, determines the denominator of the duty cycle of the target clock according to the interval between two positive edges of the positive edge detection values or the interval between two negative edges of the negative edge detection values, and then calculates the duty cycle of the target clock according to the numerator and the denominator. For example, if the positive edge detection values are 00010000000001000000000 while the negative edge detection values are 000000000010000000000100, the calculation circuit 150 may take the interval 6 between the first positive edge of the positive edge detection values and the first negative edge of the negative edge detection values to be the numerator of the duty cycle of the target clock, take the interval 10 between two adjacent positive or negative edges to be the denominator of the duty cycle of the target clock, and then derive the duty cycle 6/10, i.e. 60%, from the numerator 6 divided by the denominator 10. In this embodiment, the calculation circuit 150 further includes a storage unit (not shown) to store the derived duty cycle for access.

Figure 5:
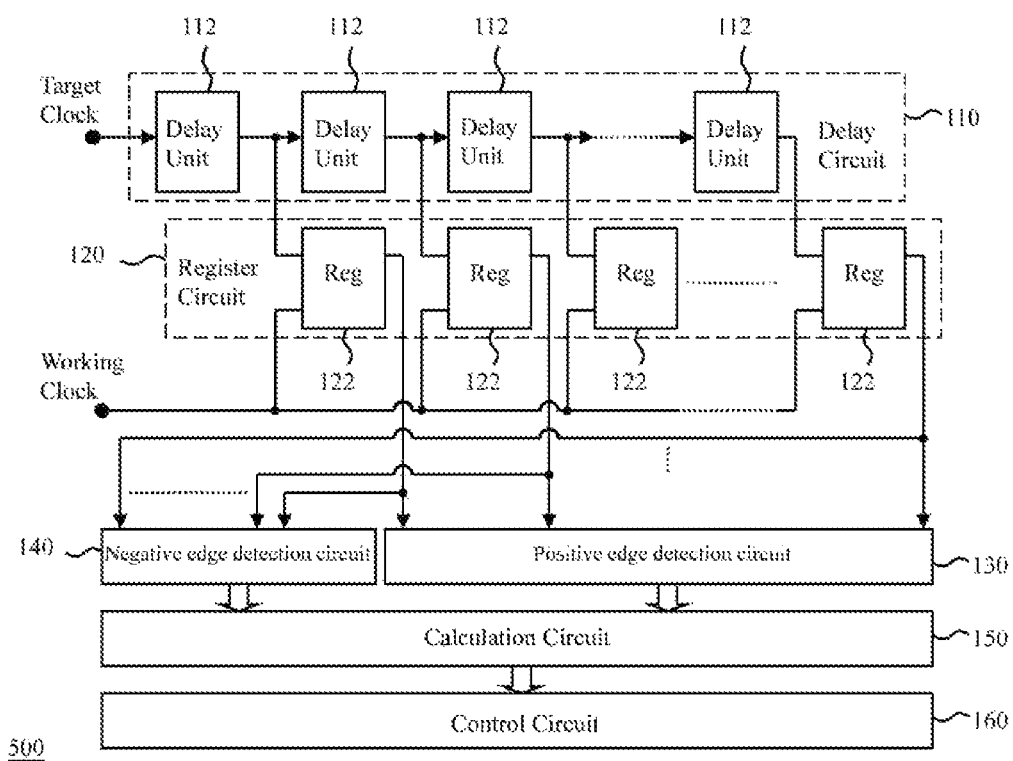
FIG. 5 illustrates a further embodiment of the clock edge detection device of the present invention.

Please refer to FIG. 5 which illustrates a further embodiment of the clock edge detection device of the present invention. The clock edge detection device 500 of FIG. 5 in comparison with FIG. 4 further comprises: a control circuit 160 coupled to the calculation circuit 150 for adjusting the duty cycle of a clock in accordance with the duty cycle of the target clock, wherein said clock could be the target clock itself or the source clock thereof. Said control circuit 160 could be realized through the known pulse width modulation technique or other known duty-cycle adjustment techniques. Since people of ordinary skill in the art are able to choose appropriate known techniques to implement the control circuit 160 in light of their demand and design resources, unnecessary explanation will therefore be omitted provided that the remaining disclosure are still enough for understanding and enablement.

Figure 6:
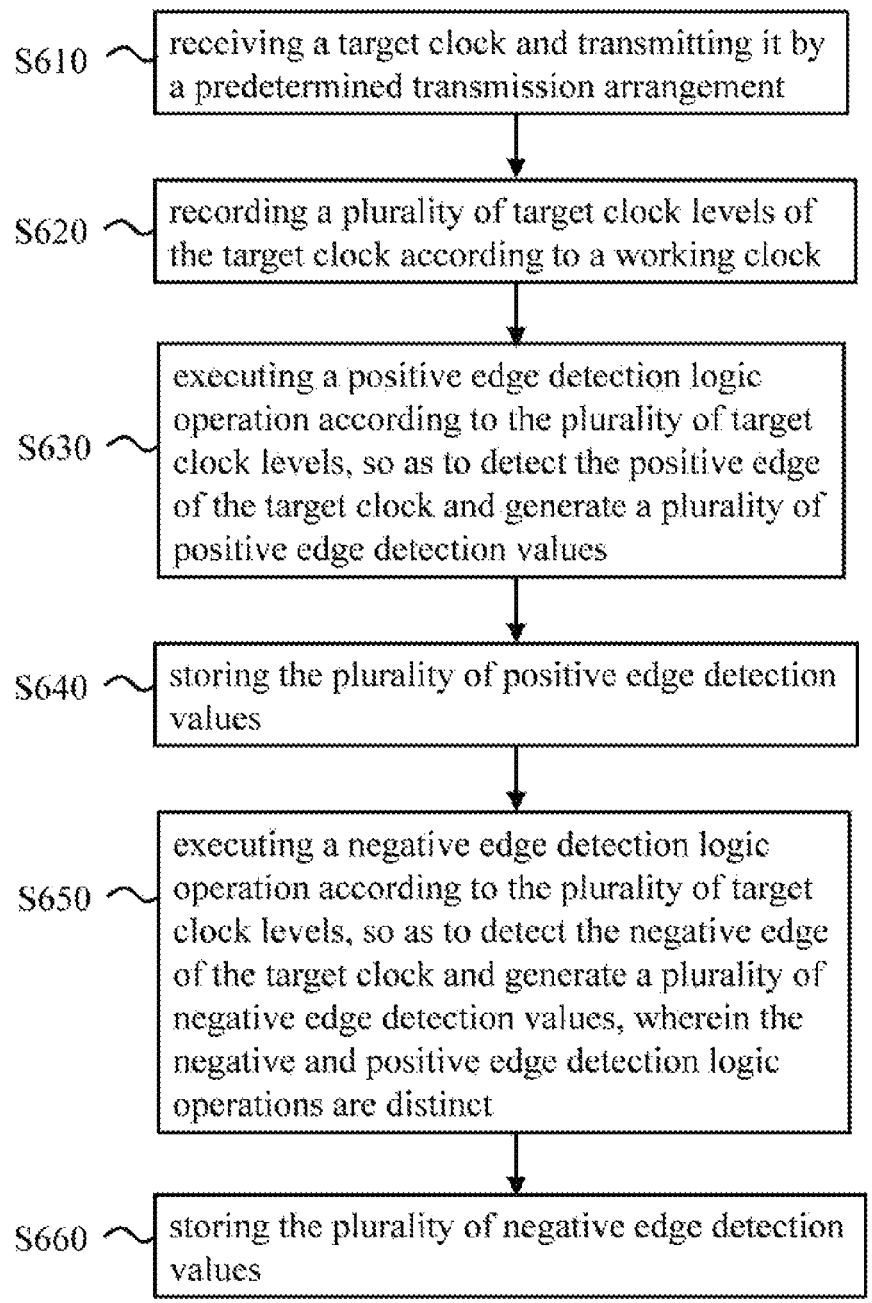
FIG. 6 illustrates an embodiment of the clock edge detection method of the present invention.

Please refer to FIG. 6. In addition to the fore-disclosed clock edge detection device, the present invention also discloses a clock edge detection method capable of detecting the positive and negative edges of a target clock. Said method could be carried out by the clock edge detection device of this invention or its equivalent, and comprises the following steps:

Step S610: receiving the target clock and transmitting it by a predetermined transmission arrangement. This step could be carried out by the delay circuit 110 of FIG. 1 or the equivalent thereof.

Step S620: recording a plurality of target clock levels of the target clock according to a working clock. This step could be carried out by the register circuit 120 of FIG. 1 or its equivalent.

Step S630: executing a positive edge detection logic operation according to the plurality of target clock levels, so as to detect the positive edge of the target clock and generate a plurality of positive edge detection values. This step could be carried out by the positive edge detection circuit 130 of FIG. 1 or its equivalent.

Step S640: storing the plurality of positive edge detection values. This step could be carried out by the storage unit 1324 of FIG. 2a and FIG. 2b or the equivalent thereof.

Step S650: executing a negative edge detection logic operation according to the plurality of target clock levels, so as to detect the negative edge of the target clock and generate a plurality of negative edge detection values, wherein the negative edge detection logic operation is distinct from the positive edge detection logic operation. This step could be carried out by the negative edge detection circuit 140 of FIG. 1 or its equivalent.

Step S660: storing the plurality of negative edge detection values, wherein the negative edge detection values record at least two negative edges while the positive edge detection values record at least one positive edge, or the positive edge detection values record at least two positive edges while the negative edge detection values record at least one negative edge. This step could be carried out by the storage unit 1424 of FIG. 3a and FIG. 3b or the equivalent thereof.

In light of the above, if the predetermined transmission arrangement is realized through a plurality of inverters (as shown in FIG. 2a and FIG. 3a), the positive edge detection logic operation performs a first process to the early two of three successive target clock levels and performs a second process to the latter two of said three successive target clock levels, and the negative edge detection logic operation performs the second process to the early two of three successive target clock levels and performs the first process to the latter two of said three successive target clock levels. In this embodiment, the first process is the combination of an inversion process and a Logic-AND process, and the second process is the Logic-AND process. Besides, if the predetermined transmission arrangement is realized through a plurality of buffers (as shown in FIG. 2b and FIG. 3b), the positive edge detection logic operation performs a third process to any successive two target clock levels, and the negative edge detection logic operation performs a fourth process to any successive two target clock levels. In this embodiment, the third process gives the early one of the two successive target clock levels a Logic-AND process and gives the latter one an inversion process and the Logic-AND process, and the fourth process gives the early one of the two successive target clock levels the inversion and Logic-AND processes and gives the latter one the Logic-AND process.

Figure 7:
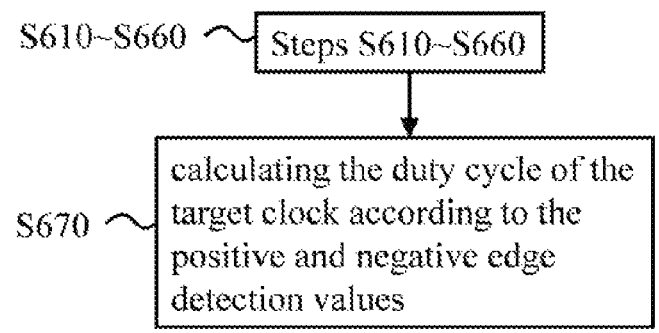
FIG. 7 illustrates another embodiment of the clock edge detection method of the present invention.

Please refer to FIG. 7 which illustrates another embodiment of the clock edge detection method of the present invention. Comparing to FIG. 6, this embodiment further comprises the following step:

Step S670: calculating the duty cycle of the target clock according to the positive and negative edge detection values. For instance, this step may be accomplished by determining the numerator of the duty cycle of the target clock according to the interval between a positive edge of the positive edge detection values and a negative edge of the negative edge detection values, determining the denominator of the duty cycle of the target clock according to the interval between two positive edges of the positive edge detection values or the interval between two negative edges of the negative edge detection values, and then calculating the duty cycle of the target clock according to the numerator and the denominator. Step S670 could be carried out by the calculation circuit 150 of FIG. 4 or the equivalent thereof.

Figure 8:
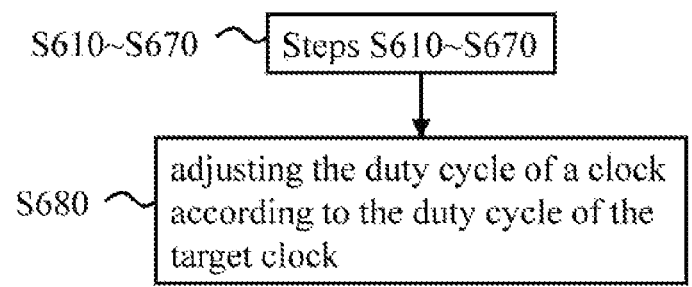
FIG. 8 illustrates a further embodiment of the clock edge detection method of the present invention.

Please refer to FIG. 8 which illustrates a further embodiment of the clock edge detection method of the present invention. In comparison with FIG. 7, this embodiment further comprises the following step:

Step S680: adjusting the duty cycle of a clock according to the duty cycle of the target clock. Said clock could be the target clock itself or the source clock thereof. This step could be carried out by the control circuit 160 of FIG. 5 or the equivalent thereof.

Since people of ordinary skill in the art can appreciate the implementation detail and changes on the method invention illustrated by FIG. 6 through FIG. 8 in light of the disclosure and teaching on the device invention illustrated by FIG. 1 through FIG. 5, repeated and redundant description is therefore omitted provided that the remaining description is still sufficient for understanding and enablement. Besides, please note that the shape, size, and scale of any element and the step sequence of any flow chart in the disclosed figures are just exemplary for understanding, not for limiting the scope of the present invention. Furthermore, each embodiment in this specification includes one or more features; however, this doesn't mean that one carrying out the present invention should make use of the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility in carrying out the present invention.

In brief, the clock edge detection device and method of the present invention are able to detect the positive and negative edges of a target clock, so as to find out whether manufacturing process variation or an operating condition (e.g. operating voltage or bias) or etc. causes the duty cycle of the target clock some influence; afterward the detection result could be used for timing calibration or future design reference.

The aforementioned descriptions represent merely the preferred embodiment of the present invention, without any intention to limit the scope of the present invention thereto. Various equivalent changes, alterations, or modifications based on the claims of present invention are all consequently viewed as being embraced by the scope of the present invention.

What is claimed is:

1. A clock edge detection device capable of detecting the positive and negative edges of a target clock, comprising:
   a delay circuit including a plurality of delay units connected in series for receiving and transmitting the target clock by a predetermined transmission arrangement;
   a register circuit including a plurality of registers coupled to the delay circuit for recording and outputting target clock levels of the target clock in accordance with a working clock whose frequency is higher than the frequency of the target clock, wherein each of the registers includes a data input end for receiving the target clock from one of the delay units, a data output end, and a working clock reception end for receiving the working clock;
   a positive edge detection circuit including a plurality of positive edge detectors coupled to the data output ends of the register circuit for detecting the positive edge of the target clock, wherein each of the positive edge detectors includes a positive edge detection unit for generating a positive edge detection value according to the target clock levels from adjacent two of the registers; and
   a negative edge detection circuit including a plurality of negative edge detectors coupled to the data output ends of the register circuit for detecting the negative edge of the target clock, wherein the configuration of the negative edge detection circuit is not identical to the configuration of the positive edge detection circuit in consideration of the predetermined transmission arrangement and each of the negative edge detectors includes a negative edge detection unit for generating a negative edge detection value according to the target clock levels from adjacent two of the registers,
   wherein the positive edge detection values record at least two positive edges and the negative edge detection values record at least one negative edge, or the negative edge detection values record at least two negative edges and the positive edge detection values record at least one positive edge.

2. The clock edge detection device of claim 1, wherein the delay units are inverters, one among adjacent two of the positive edge detectors is operable to perform an inversion process and a Logic-AND process to the target clock levels while the other one of said adjacent two positive edge detectors is operable to perform the Logic-AND process to the target clock levels, and one among adjacent two of the negative edge detectors is operable to perform the Logic-AND process to the target clock levels while the other one of said adjacent two negative edge detectors is operable to perform the inversion process and the Logic-AND process to the target clock levels, so that the positive and negative edge detectors are operable to generate the positive and negative edge detection values.

3. The clock edge detection device of claim 1, wherein the delay units are buffers, the positive edge detectors are identical, and the negative edge detectors are identical.

4. The clock edge detection device of claim 1, wherein if both the target clock levels bound for one of the positive edge detectors pass through an odd or even number of inverter(s), said positive edge detector performs an inversion process to the transmission-sequence-later one of the target clock levels, and then performs a Logic-AND process to both of the target clock levels; if the target clock levels bound for one of the positive edge detectors pass through an odd number of inverter(s) and an even number of inverter(s) respectively, said positive edge detector performs the inversion and Logic-AND processes to both of the target clock levels if it pertains to an odd number of a positive edge detector connection sequence but performs the Logic-AND process to both of the target clock levels if it pertains to an even number of the positive edge detector connection sequence; if both the target clock levels bound for one of the negative edge detectors pass through an odd or even number of inverter(s), said negative edge detector performs the inversion process to the transmission-sequence-early one of the target clock levels and then performs the Logic-AND process to both of the target clock levels; and if the target clock levels bound for one of the negative edge detectors pass through an odd number of inverter(s) and an even number of inverter(s) respectively, said negative edge detector performs the Logic-AND process to both of the target clock levels if it pertains to an odd number of a negative edge detector connection sequence but performs the inversion and Logic-AND processes to both of the target clock levels if it pertains to an even number of the negative edge detector connection sequence.

5. The clock edge detection device of claim 1, wherein the registers are flip-flops.

6. The clock edge detection device of claim 1, wherein each of the positive edge detectors further includes:
    a positive edge detection value storage unit for recording the positive edge detection value according to the working clock; and
    each of the negative edge detectors further includes:
    a negative edge detection value storage unit for recording the negative edge detection value according to the working clock.

7. The clock edge detection device of claim 1, further comprising:
    a calculation circuit coupled to the positive and negative edge detection circuits for calculating the duty cycle of the target clock according to the positive and negative detection values.

8. The clock edge detection device of claim 7, wherein the calculation circuit determines the numerator of the duty cycle of the target clock according to the interval between a positive edge of the positive edge detection values and a negative edge of the negative edge detection values, determines the denominator of the duty cycle of the target clock according to the interval between two positive edges of the positive edge detection values or the interval between two negative edges of the negative edge detection values, and then calculates the duty cycle of the target clock according to the numerator and the denominator.

9. The clock edge detection device of claim 7, further comprising: a control circuit coupled to the calculation circuit for adjusting the duty cycle of a clock in accordance with the duty cycle of the target clock.

10. The clock edge detection device of claim 1, wherein the positive edge detection values record the at least two positive edges and the negative edge detection values record the at least one negative edge for the calculation of the duty cycle of the target clock, or the negative edge detection values record the at least two negative edges and the positive edge detection values record the at least one positive edge for the calculation of the duty cycle of the target clock.

11. A clock edge detection method capable of detecting the positive and negative edges of a target clock, comprising:
    receiving the target clock and transmitting it by a predetermined transmission arrangement;
    recording a plurality of target clock levels of the target clock according to a working clock whose frequency is higher than the frequency of the target clock;
    executing a positive edge detection logic operation according to the target clock levels, so as to detect the positive edge of the target clock and generate a plurality of positive edge detection values;
    storing the plurality of positive edge detection values;
    executing a negative edge detection logic operation according to the target clock levels, so as to detect the negative edge of the target clock and generate a plurality of negative edge detection values, wherein the positive edge detection logic operation is not identical to the negative edge detection logic operation in consideration of the predetermined transmission arrangement; and
    storing the plurality of negative edge detection values,
    wherein the positive edge detection values record at least two positive edges and the negative edge detection values record at least one negative edge, or the negative edge detection values record at least two negative edges and the positive edge detection values record at least one positive edge.

12. The clock edge detection method of claim 11, wherein the predetermined transmission arrangement is realized through a plurality of inverters, the positive edge detection logic operation performs a first process to the early two of successive three of the target clock levels and performs a second process to the latter two of the successive three target clock levels, and the negative edge detection logic operation performs the second process to the early two of successive three of the target clock levels and performs the first process to the latter two of the successive three target clock levels.

13. The clock edge detection method of claim 12, wherein the first process is an inversion process and a Logic-AND process, and the second process is the Logic-AND process.

14. The clock edge detection method of claim 11, wherein the predetermined transmission arrangement is realized through a plurality of buffers, the positive edge detection logic operation performs a third process to any successive two of the target clock levels, and the negative edge detection logic operation performs a fourth process to any successive two of the target clock levels.

15. The clock edge detection method of claim 14, wherein the third process gives the early one of successive two of the target clock levels a Logic-AND process and gives the latter one of the successive two target clock levels an inversion process and the Logic-AND process, and the fourth process gives the early one of successive two of the target clock levels the inversion and Logic-AND processes and gives the latter one of the successive two target clock levels the Logic-AND process.

16. The clock edge detection method of claim 11, wherein the steps of storing the positive and negative edge detection values are carried out according to the working clock.

17. The clock edge detection method of claim 11, further comprising:
calculating the duty cycle of the target clock according to the positive and negative edge detection values.

18. The clock edge detection method of claim 17, wherein the step of calculating the duty cycle of the target clock includes:
determining the numerator of the duty cycle of the target clock according to the interval between a positive edge of the positive edge detection values and a negative edge of the negative edge detection values;
determining the denominator of the duty cycle of the target clock according to the interval between two positive edges of the positive edge detection values or the interval between two negative edges of the negative edge detection values; and
calculating the duty cycle of the target clock according to the numerator and the denominator.

19. The clock edge detection method of claim 17, further comprising: adjusting the duty cycle of a clock according to the duty cycle of the target clock.

20. The clock edge detection method of claim 11, wherein the positive edge detection values record the at least two positive edges and the negative edge detection values record the at least one negative edge for the calculation of the duty cycle of the target clock, or the negative edge detection values record the at least two negative edges and the positive edge detection values record the at least one positive edge for the calculation of the duty cycle of the target clock.

* * * * *